United States Patent [19]

Kreifels et al.

[11] Patent Number: 4,860,261
[45] Date of Patent: Aug. 22, 1989

[54] LEAKAGE VERIFICATION FOR FLASH EPROM

[75] Inventors: Jerry A. Kreifels, Citrus Heights; George Hoekstra, Santa Clara, both of Calif.

[73] Assignee: Intel Corporation, Santa Clara, Calif.

[21] Appl. No.: 323,310

[22] Filed: Mar. 14, 1989

Related U.S. Application Data

[62] Division of Ser. No. 157,364, Feb. 17, 1988, Pat. No. 4,841,482.

[51] Int. Cl.[4] ............................................. G11C 13/00
[52] U.S. Cl. .................................... 365/218; 365/201; 371/28; 371/67
[58] Field of Search ................. 365/218, 201; 371/21, 371/25, 28, 67

[56] References Cited

U.S. PATENT DOCUMENTS 4,797,586 1/1989 Lee et al. ............................ 365/218

Primary Examiner—Terrell W. Fears
Attorney, Agent, or Firm—Blakely, Sokoloff, Taylor & Zafman

[57] ABSTRACT

A circuit and method for verifying leakage in a flash EPROM/EEPROM memory cell which is fabricated on a silicon substrate having floating gate. A word line coupled to the control gate of the memory cell is typically at ground potential, but during a test mode a positive voltage is placed on the control gate and leakage current at the drain is measured. A good cell will typically have zero or negligible drain leakage current, however, a cell which is susceptible to being overerased will exhibit appreciable leakage current. A circuit is implemented on the chip with the memory for switching a positive voltage onto the word line during the test mode.

1 Claim, 1 Drawing Sheet

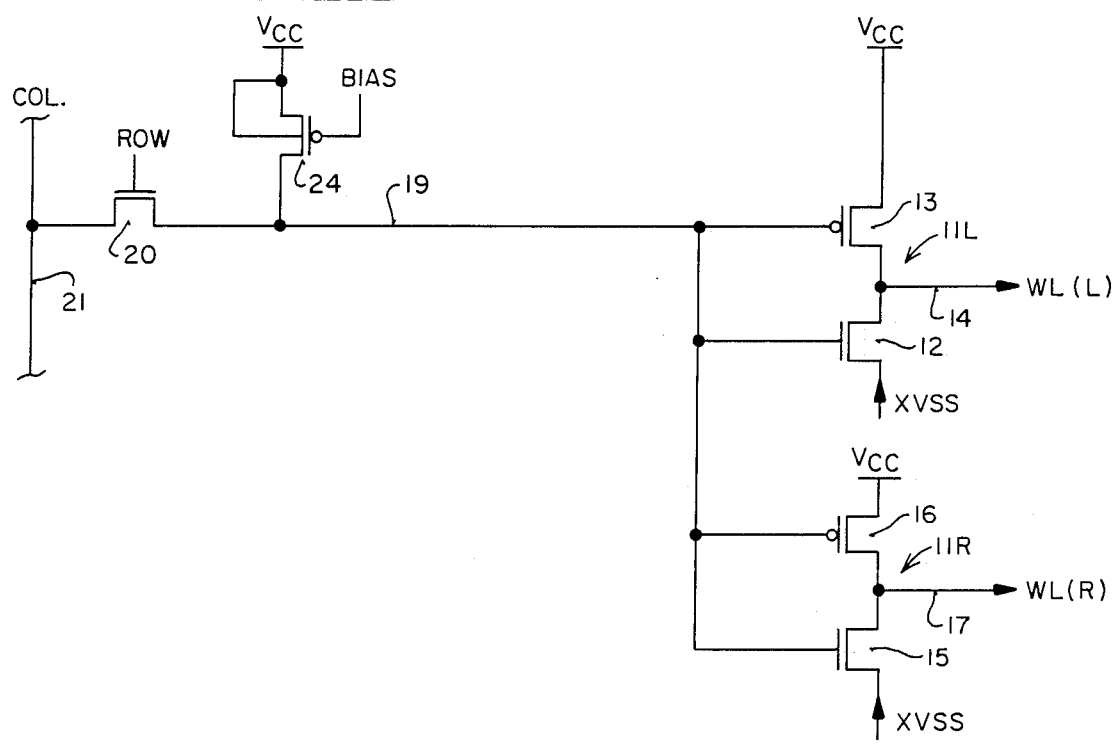
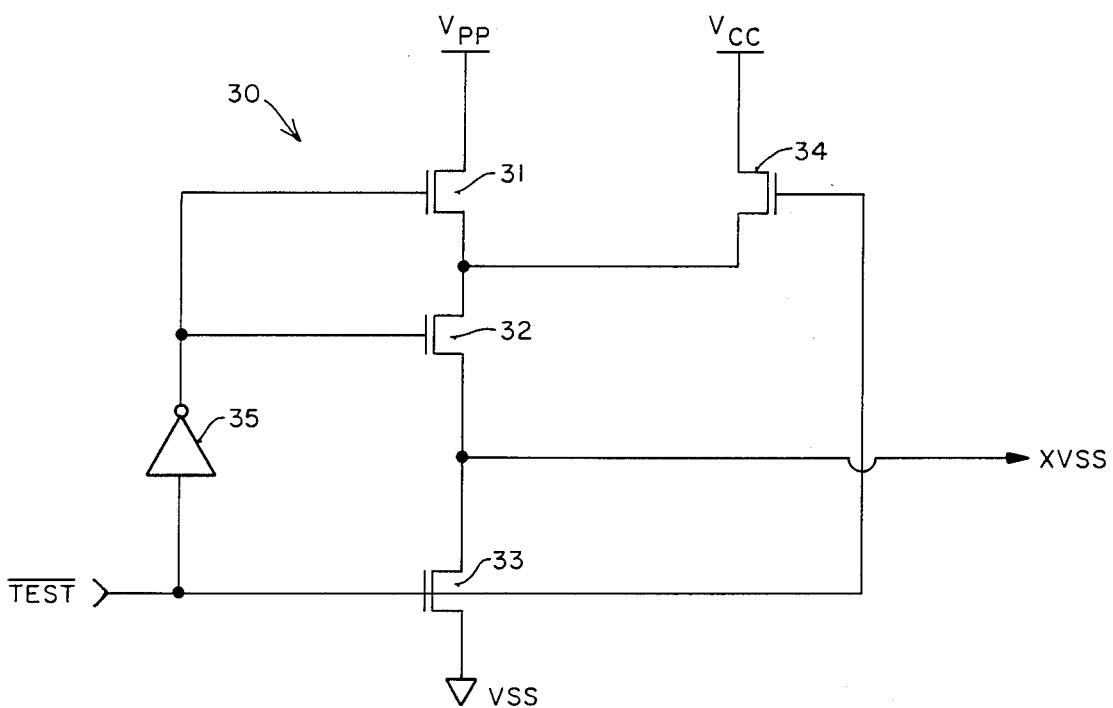

LEAKAGE VERIFICATION FOR FLASH EPROM

This is a continuation/divisional of application Ser. No. 157,364 filed Feb. 17, 1988 to become U.S. Pat. No. 4,841,482.

BACKGROUND OF THE PRESENT INVENTION

1. Field of the invention

The present invention relates to the field of metal-oxide-semiconductor (MOS), electrically programmable and electrically erasable read-only memories (EEPROMs) and to electrically programmable read-only memories (EPROMs) having floating gates.

2 Related application

This application relates to copending application Ser. No. 892,446, filed Aug. 4, 1986, and entitled LOW VOLTAGE EEPROM CELL; copending application Ser. No. 157,362, filed Feb. 17, 1988, entitled PROCESSOR CONTROLLED COMMAND PORT ARCHITECTURE FOR FLASH MEMORY; copending application Ser. No. 157,361, filed Feb. 17, 1988, entitled PROGRAM/ERASE SELECTION FOR FLASH MEMORY; copending application Ser. No. 144,567, filed Jan. 12, 1988, entitled VOLTAGE MARGINING CIRCUIT FOR FLASH EPROM; copending application Ser. No 1444,569 filed Jan. 12, 1988, entitled LOAD LINE FOR FLASH EPROM; all assigned to the assignee of the present invention.

3. Prior art

Fabrication of electrically programmable read-only-memories (EPROMs) utilizing metal-oxide-semiconductor (MOS) technology is well-known in the prior art (see U.S. Pat. Nos. 3,660,819; 4,142,926; 4,114,255; and 4,412,310). These EPROMs employ memories cells utilizing floating gates which are generally formed from polysilicon members completely surrounded by an insulator. Electrical charges are transferred into the floating gate using a variety of techniques such as avalanche injection, channel injection, Fowler-Nordeheim tunnelling, channel hot electron injection, etc. A variety of phenomena have been used to remove charge from the floating gate, including exposing the memory to ultraviolet radiation. The floating gate is programmed when a charge is stored in the floating gate. The cell is in an unprogrammed, or erased, state when the floating gate is discharged. Because of complex and time consuming procedures required to erase EPROMs, these devices have been used primarily in applications requiring read-only-memories.

Electrically programmable and electrically erasable read-only-memories (EEPROMs) were developed to provide the capability of electrically erasing programmed memory cells (see U.S. Pat. Nos. 4,203,138 and 4,099,196). Commercially available EEPROMs have generally used a thin oxide region to transfer the charge into and from a floating gate. In a typical memory, a two transistor cell is used. For instance, U.S. Pat. No. 4,203,158 discloses the fabrication of such an EEPROM cell. Further, U.S. Pat. No. 4,266,283 discloses the arrangement of EEPROMs into an array wherein X and Y select lines provide for the selection, programming and reading of various EEPROM cells. These EEPROM cells do not lend themselves to being reduced in substrate are as do the EPROM cells. Various techniques have been implemented to reduce the size of the memory array by providing higher-density cells. One such technique is disclosed in U.S. Pat. No. 4,432,075.

More recently, a new category of electrically erasable EPROMs/EEPROMs has emerged and these devices are sometimes referred to as "Flash" EPROMs or EEPROMs. In these flash memories, the entire array is simultaneously erased, electrically. The cells themselves use only a single device per cell and such cells are described in the afore-mentioned copending application Ser. No. 892,446. Another relevant art is an article entitled "A 256-K Bit Flash E$^2$PROM Using Triple-Polysilicon Technology", Masuoka et al., IEEE Journal of Solid-State Circuits, Vol. SC-22, No. 4, August, 1987. The present invention is directed towards the use of these cells.

An attempt to provide higher-density, low voltage EEPROMs cell is disclosed in the afore-mentioned copending Application, Ser. No. 892,446, and entitled "Low Voltage EEPROM Cell". In this copending application, a one-transistor memory cell which uses channel injection for charging the floating gate and tunnelling for discharging the gate is disclosed. A single 5 volt potential is used with a higher programming/erasing potential of approximately 11 to 15 volts being generated on-chip. However, the memory cell of the one-transistor design uses the same transistor and the same oxide separating the transistor elements from the floating gate to both program and erase the floating gate. Because of the one-transistor design, an overerase condition of a memory cell is more prevalent than in the two-transistor design. An overerased condition must be avoided in order to prevent the one-transistor memory cell from becoming a depletion like transistor in the read mode. During the read mode an overerased memory cell will disable a whole column of a memory array if the memory cells are structured as an array. The overerased problem is not typically a concern with the two-transistor design or the quasi-one-transistor EEPROM design, which is disclosed in a copending patent application Ser. No. 009,998, filed Feb. 2, 1987, which is also assigned to the assignee of the present invention. However, again, the twotransistor design will require much bigger cell area while the quasi-one-transistor EEPROM described in the Ser. No. 009,998 reference requires more processing steps.

Typically when flash memory cells are fabricated, these memory devices are tested to determine for failed cells. However, in performing this test, only those devices having cells which have failed or fail during the test are identified. Because the memory cells are subjected to voltages which are encountered under normal operation, the prior art test method does not subject the memory cells to additional stress.

A related application Ser. No. 039,086, filed Apr. 16, 1987 and entitled "Self-Limiting Erase Scheme For EEPROM" describes a biasing scheme which self limits the erasing sequence of the memory cell to prevent an overerase condition. However, this scheme does not detect failures or potential failures when a device is tested after fabrication.

It is appreciated that what is needed is a circuit and a method of stress testing a memory cell with added stress to determine any potential memory cell failures which are not typically discovered in prior art test modes.

SUMMARY OF THE INVENTION

A circuit and a method to verify faulty memory cells in an electrically erasable and electrically programmable read-only memory having a plurality of memory cells, each containing a floating gate is described. Under normal operation when a memory cell is deselected, a ground potential is placed on a word line which is coupled to the control gate of the appropriate memory cell. However during a test verification mode, a positive voltage is switched onto the word line to bias the flash memory cell. Leakage current is measured on a bit line coupled to the drain of the memory cell. If a cell is faulty and leakage current above a threshold level is detected, then the cell is susceptble to being overerased. By measuring the amount of the leakage current during this test mode, those cells which are susceptible to future failure are determined.

The circuit which provides the switching between ground and the test voltage is comprised of four transistors and an inverter. One transistor is activated to place a ground onto the word line during normal operation when the cell is deselected. During the test mode the first transistor is deactivated and two other transistors conduct to provide a voltage onto the word line for biasing the memory cell. A fourth transistor protects the aforementioned two transistors from high voltage when they are deactivated.

BRIEF DESCRIPTION OF THE DRAWINGS

FIG. 1 is schematic diagram of a decoder circuit used with the flash memory array of the present invention.

FIG. 2 is a schematic diagram of a switching circuit for providing a ground or a biasing voltage onto the word line coupled to the flash memory.

DETAILED DESCRIPTION OF THE PRESENT INVENTION

A circuit and a method for verifying leakage in an flash EPROM/EEPROM memory cell fabricated on a silicon substrate is described. In the following description, numerous specific details are set forth, such as specific circuit configuration, components, etc., in order to provide a thorough understanding of the present invention. It will be obvious, however, to one skilled in the art that the present invention may be practiced without these specific details. In other instances, well-known processes, circuits, and control lines have not been described in detail in order not to unnecessarily obscure the present invention.

In the fabrication of flash memory chips, these semiconductor chips are tested for memory cell integrity. Aside from testing for the complete failure of a given cell, each of the flash memory cells are tested to determine for the presence of an overerase condition. The present invention takes this testing a step further by determining the susceptibility of cells to fail in the future. By applying a predetermined voltage on all of the word lines during testing of the flash memory, those cells which are susceptible to future failure due to an overerase condition will be determined by measuring a leakage current from the drain of the suspect memory cell.

Referring to FIG. 1, a portion of a decoder circuit 10 which is used with the flash memory cell of the present invention is shown. Each circuit 10 is comprised of a pair of complementary metal-oxide-semiconductor (CMOS) drivers 11L and 11R. Driver 11L is comprised of a n-channel transistor 12 and a p-channel transistor 13 coupled as a typical CMOS driver and is disposed in series between VCC and XVSS. An output 14 is coupled to word line WL(L) at the junction of transistors 12 and 13. Similarly the second driver 11R is comprised of an n-channel transistor 15 and p-channel transistor 16 coupled as a typical CMOS driver and is disposed in series between VCC and XVSS. An output 15 is coupled to word line WL(L) at the junction of transistors 15 and 16. Gates of transistors 12, 13, 15 and 16 are coupled together to node 19 and then through transistor 20 to a column line 21. Gate of transistor 20 is coupled to a row line.

The flash memory of the present invention is arranged in a matrix array structured of rows and columns and each cell is activated when its corresponding row and column is selected. The selection of memory cells by use of row and column matrices is well-known in the prior art. Further the memory cell of the present invention is split into two half arrays such that driver 11L is coupled to the left array and driver 11R is coupled to the right array. Drivers 11L and 11R are activated when its column line 21 and its row, which activates transistor 20, is selected. This causes the coupling of the gates of drivers IIL and 11R to column line 21.

A p-channel transistor 24 is coupled between VCC and node 19 and has its gate biased by a reference voltage. VCC is typically at 5 volts. Transistor 24 is utilized as a load device to pull node 19 to a predetermined potential for activating transistors 12 and 15 when drivers 11L and 11R are not selected by the column and row selection control. Whenever the appropriate column and row selection associated with WL(L) on output 14 and WL(R) on output 17 are activated, transistor 20 couples node 19 to column line 21. A low on column line 21 causes node 19 to transition to a low state activating transistors 13 and 16 and deactivating transistors 12 and 15. This places VCC (high state) onto outputs 14 and 17. That is, when the appropriate column and row is selected, word lines WL(L) and WL(R) are pulled up to VCC and when the cells are deselected word lines WL(L) and WL(R) are coupled to XVSS. It is to be appreciated that circuit 10 is replicated for other drivers on column 21 and separate row select line are coupled to associated transistors 20. Further as a plurality of column lines 21, including other circuits 10, are present to form the array selection circuitry. The word lines of each circuit 10 are then coupled to individual flash memory cells.

Under normal operation, when a given cell is deselected its word line, WL(L) or WL(R), is coupled to XVSS due to the conduction of transistors 12 and 15. A deselected flash memory cell will have 0 volts on its gate, 0 volts on its source, and either 0 volts or approximately 1.2 volts on its drain depending on the state of the bit line connected to the drain. That is, the appropriate bit line is coupled to the drain of the flash cell and the voltage will depend upon the selection of this bit line. The control gates of the flash memory cells are coupled to its appropriate word line WL(L) or WL(R). Under normal operation, XVSS is set to 0 volts.

To determine a failed or an overerased cell, all cells are deselected and XVSS is set to 0 volts and current flow from that memory cell is measured on the bit line. However, to determine susceptible or suspect cells, cells which have not failed currently but are susceptible to future failure, a voltage is placed on its word line to slightly bias the memory cell. The present invention, therefore, causes the word lines to have a small positive voltage in order to measure leakage current on the drain of the memory cell. A leaky cell under this condition has been found to be susceptible to being overerased. By placing a small positive voltage onto the word line while the cell is deselected, leakage current can be measured on the bit line of the cell to determine if one or more cells coupled to the bit line are susceptible to being overerased. It is to be appreciated that multiple cells on a single bit line or on all bit lines, that is the entire memory array, can be tested simultaneously to determine device integrity to overerase conditions.

Referring to FIG. 2, a circuit for switching XVSS between 0 volts and its non-zero test voltage is shown. Circuit 30 is comprised of transistors 31–34 and inverter 35. The drain of transistor 31 is coupled to VPP and its source is coupled to the drain of transistor 32. VPP is typically at 5 volts during read mode and approximately at 12.5v during program and erase modes. The source of transistor 32 is coupled to the drain of transistor 33 and this junction is the node for providing the value XVSS. The source of transistor 33 is coupled to ground, which is 0 volts. The gates of transistors 31 and 32 are coupled to the output of inverter 35. The gate of transistor 33 and the input of inverter 35 are coupled to a control signal $\overline{TEST}$.

Under normal operation $\overline{TEST}$ is high, activating transistor 33 and coupling ground potential as XVSS. However when leakage verification test is to be performed, $\overline{TEST}$ goes low, activating transistors 31 and 32 and turning off transistor 33. The $\overline{TEST}$ signal is also coupled to the gate of transistor 34, which drain is coupled to VCC and its source coupled to the junction of transistors 31 and 32. Transistor 34 is provided to protect transistors 31 and 32 from the stress of 12.5v across them during programming by coupling the source of transistor 31 to a voltage above 0 volts. When $\overline{TEST}$ signal is low, transistor 34 is also deactivated. The conduction of transistors 31 and 32 causes the voltage on VPP to be coupled to XVSS. It is to be appreciated that the value of XVSS can be made to vary from 0v to approximately 3v depending on the value of VPP during the $\overline{TEST}$. However, as used in the preferred embodiment, 0.3 volts is placed on line XVSS when the leakage verification test is to be performed. When 0.3 volts is placed on the appropriate word line of a given flash memory cell, its bit line is measured for a leakage current of approximately 10 microamperes. If this leakage current is detected, then it is known that one or more cells have failed or are susceptible to failure in the future. A bit line coupled to all good cells has zero or negligible leakage current.

Therefore, by placing a small positive voltage on a word line of a memory cell, the cell can be tested for susceptibility to being overerased. It is also appreciated that all cells on a single bit line can be tested or in the alternative, all cells of several bit lines may be tested simultaneously. Further, the biasing test voltage for XVSS and the value of the leakage current can be of different values then what is described in the example of the preferred embodiment, such variation being dependant on the character of the memory cell and the associated circuitry. As implemented in the preferred embodiment, circuit 30 is incorporated on the same semiconductor chip as the flash memory.

Thus, a leakage verification circuit to test for a suspect memory cell is described.

We claim:

1. A method for determining if an electrically erasable and electrically programmable read-only memory having a plurality of memory cells which each has a floating gate, comprising the steps of:

placing a small positive voltage on control gates of said memory cells;

measuring leakage current at drains of said memory cells; and determining if leakage current exceeds a predetermined value, which is an indication of susceptibility to an overerase condition.

* * * * *

UNITED STATES PATENT AND TRADEMARK OFFICE
CERTIFICATE OF CORRECTION

PATENT NO. : 4,860,261

DATED : August 22, 1989

INVENTOR(S) : Kreifels et al.

It is certified that error appears in the above—identified patent and that said Letters Patent is hereby corrected as shown below:

Column 6, line 27, "if" should be --- leakage in ----.

Signed and Sealed this

Twenty-first Day of August, 1990

Attest:

HARRY F. MANBECK, JR.

*Attesting Officer*     *Commissioner of Patents and Trademarks*

UNITED STATES PATENT AND TRADEMARK OFFICE
CERTIFICATE OF CORRECTION

PATENT NO. : 4,860,261
DATED : 8/22/89
INVENTOR(S) : Jerry A. Krifels and George Hoekstra It is certified that error appears in the above-indentified patent and that said Letters Patent is hereby corrected as shown below:

Col. 1, line 65, delete "are" and insert --area--.
Col. 2, line 42, delete "twotransistor" and insert --two-transistor--.
Col. 4, line 21, delete "IIL" and insert --llL--.

Signed and Sealed this

Twenty-sixth Day of April, 1994

Attest:

BRUCE LEHMAN

Attesting Officer

Commissioner of Patents and Trademarks